United States Patent
Hshieh et al.

(10) Patent No.: US 6,770,548 B2
(45) Date of Patent: Aug. 3, 2004

(54) TRENCH SCHOTTKY RECTIFIER

(75) Inventors: Fwu-Iuan Hshieh, Saratoga, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/429,817

(22) Filed: May 5, 2003

(65) Prior Publication Data

US 2003/0193074 A1 Oct. 16, 2003

Related U.S. Application Data

(62) Division of application No. 09/872,976, filed on Jun. 1, 2001, now Pat. No. 6,580,141.

(51) Int. Cl.[7] ............................ H01L 21/28; H01L 21/44
(52) U.S. Cl. ..................... 438/576; 438/570; 438/571; 438/572; 438/92; 438/167
(58) Field of Search ....................... 438/570, 571, 438/572, 576, 92, 167; 257/471, 475

(56) References Cited

U.S. PATENT DOCUMENTS

| | | | |
|---|---|---|---|
| 4,835,580 A | * 5/1989 | Havemann et al. | ......... 257/478 |
| 5,365,102 A | 11/1994 | Mehrotra et al. | ........... 257/475 |
| 5,612,567 A | 3/1997 | Baliga | ......................... 257/475 |
| 6,078,090 A | 6/2000 | Williams et al. | ............. 257/476 |
| 6,184,563 B1 | 2/2001 | Yu | .............................. 257/471 |

* cited by examiner

Primary Examiner—Maria Guerrero
(74) Attorney, Agent, or Firm—Mayer Fortkort & Williams, PC; Stuart H. Mayer, Esq.; Karin L. Williams, Esq.

(57) ABSTRACT

A Schottky rectifier is provided. The Schottky rectifier comprises: (a) a semiconductor region having first and second opposing faces, with the semiconductor region comprising a cathode region of first conductivity type adjacent the first face and a drift region of the first conductivity type adjacent the second face, and with the drift region having a lower net doping concentration than that of the cathode region; (b) one or more trenches extending from the second face into the semiconductor region and defining one or more mesas within the semiconductor region; (c) an insulating region adjacent the semiconductor region in lower portions of the trench; (d) and an anode electrode that is (i) adjacent to and forms a Schottky rectifying contact with the semiconductor at the second face, (ii) adjacent to and forms a Schottky rectifying contact with the semiconductor region within upper portions of the trench and (iii) adjacent to the insulating region within the lower portions of the trench.

10 Claims, 5 Drawing Sheets

TRENCH SCHOTTKY RECTIFIER

STATEMENT OF RELATED APPLICATIONS

This application is a division of U.S. patent application Ser. No. 09/872,926 entitled "Trench Schottky Rectifier" filed on Jun. 1, 2001 now U.S. Pat. No. 6,580,141.

FIELD OF THE INVENTION

This invention relates to rectifiers and more particularly to Schottky barrier rectifying devices, and methods of forming these devices.

BACKGROUND OF THE INVENTION

Rectifiers exhibit relatively low resistance to current flow in a forward direction and a high resistance to current flow in a reverse direction. Schottky barrier rectifiers are a type of rectifier that have found use as output rectifiers in switching-mode power supplies and in other high-speed power switching applications, such as motor drives. These devices are capable of carrying large forward currents and supporting large reverse blocking voltages.

U.S. Pat. No. 5,365,102 to Mehrotra et al. and entitled "Schottky Barrier Rectifier with MOS Trench", the entire disclosure of which is hereby incorporated by reference, discloses Schottky barrier rectifiers which have a higher breakdown voltage than is theoretically attainable with an ideal abrupt parallel-plane P-N junction. A cross-sectional representation of one embodiment of the described rectifiers is illustrated in FIG. 1. In this figure, rectifier 10 includes a semiconductor substrate 12 of first conductivity type, typically N-type conductivity, having a first face 12a and a second opposing face 12b. The substrate 12 comprises a relatively highly doped cathode region 12c (shown as N+) adjacent the first face 12a. A drift region 12d of first conductivity type (shown as N) extends from the cathode region 12c to the second face 12b. Accordingly, the doping concentration of the cathode region 12c is greater than that of the drift region 12d. A mesa 14 having a cross-sectional width "Wm", defined by opposing sides 14a and 14b, is formed in the drift region 12d. The mesa can be of stripe, rectangular, cylindrical or other similar geometry. Insulating regions 16a and 16b (described as $SiO_2$) are also provided on the mesa sides. The rectifier also includes an anode electrode 18 on the insulating regions 16a, 16b. The anode electrode 18 forms a Schottky rectifying contact with the mesa 14 at second face 12b. The height of the Schottky barrier formed at the anode electrode/mesa interface is dependent on the type of electrode metal and semiconductor (e.g., Si, Ge, GaAs, and SiC) used and is also dependent on the doping concentration in the mesa 14. Finally, a cathode electrode 20 is provided adjacent the cathode region 12c at the first face 12a. The cathode electrode 20 ohmically contacts cathode region 12c.

As the voltages of modern power supplies continue to decrease in response to the need for reduced power consumption and increased energy efficiency, it becomes more advantageous to decrease the on-state voltage drop across a power rectifier, while still maintaining high forward-biased current density levels. As well known to those skilled in the art, the on-state voltage drop is generally dependent on the forward voltage drop across the metal/semiconductor junction and the series resistance of the semiconductor region and cathode contact.

The need for reduced power consumption also generally requires minimizing the reverse-biased leakage current. The reverse-biased leakage current is the current in the rectifier during a reverse-biased blocking mode of operation. To sustain high reverse-biased blocking voltages and minimize reverse-biased leakage currents, the semiconductor portion of the rectifier is typically lightly doped and made relatively thick so that the reverse-biased electric field at the metal/semiconductor interface does not become excessive. The magnitude of the reverse-biased leakage current for a given reverse-biased voltage is also inversely dependent on the Schottky barrier height (potential barrier) between the metal and semiconductor regions. Accordingly, to achieve reduced power consumption, both the forward-biased voltage drop and reverse-biased leakage current should be minimized and the reverse blocking voltage should be maximized.

According to U.S. Pat. No. 5,612,567, desirable effects are achieved with the device of FIG. 1, due to the occurrence of charge coupling between the majority charge carriers in the mesa-shaped portion of the drift region 14 and the portion of the metal anode 18 opposite the insulated sidewalls 16a, 16b of the trenches. Specifically, the electric field at the center of the metal-semiconductor contact (Schottky contact) is reduced significantly relative to an ideal plane-parallel rectifier. The reduction in electric field at the center of the Schottky contact causes a significant decrease in the reverse-biased leakage current through a reduction in Schottky barrier height lowering. Reverse-biased leakage current is the current in the rectifier during a reverse-biased (blocking) mode of operation. Moreover, the peak in the electric field profile shifts away from the metal-semiconductor contact and into the drift region. As the peak of the electric field moves away from the Schottky contact, the mesa is able to support more voltage, and thus provides higher breakdown voltages (reverse blocking voltages) than those of an ideal parallel-plane rectifier.

A graphical illustration of the breakdown voltage versus trench oxide thickness for the Schottky rectifier shown in FIG. 1 is illustrated in FIG. 2, which is a reproduction of FIG. 12 of the aforementioned patent. In particular, the breakdown voltage is shown as monotonically increasing with oxide thickness up to at least 2200 Angstroms. The graphical illustration of FIG. 2 was obtained for a Schottky rectifier having a mesa width and cell pitch of 0.5 microns and 1 micron, respectively, and a trench depth and drift region thickness of 3 microns and 4 microns, respectively.

As FIG. 2 indicates, Schottky rectifiers to be used in high voltage applications require a relatively thick trench oxide layer. The oxide layer is typically grown by a thermal technique, which is advantageous employed because it provides good epitaxy with a reduced defect density at the oxide-semiconductor interface. Unfortunately, the slow growth rates associated with thermally grown oxide layers make it difficult to achieve a trench oxide layer with a thickness upwards of 2000 Angstroms. Moreover, alternative growth techniques such as chemical vapor deposition (CVD), while having greater deposition rates, produce a greater defect density and hence a higher charge at the oxide-semiconductor interface.

Accordingly, there remains a need within the art to provide a trench Schottky rectifier device that can be operated at high voltages and which is relatively easy to fabricate.

SUMMARY OF THE INVENTION

The above and other needs are met by the present invention. In particular, a Schottky rectifier is provided which comprises: (a) a semiconductor region having first and second opposing faces, with the semiconductor region comprising a cathode region of first conductivity type adjacent the first face and a drift region of the first conductivity type adjacent the second face, and with the drift region having a lower net doping concentration than that of the cathode region; (b) one or more trenches extending from the second face into the semiconductor region and defining one or more mesas within the semiconductor region; (c) an insulating region adjacent the semiconductor region in lower portions of the trench; (d) and an anode electrode that is (i) adjacent to and forms a Schottky rectifying contact with the semiconductor region at the second face, (ii) adjacent to and forms a Schottky rectifying contact with the semiconductor region within upper portions of the trench and (iii) adjacent to the insulating region within the lower portions of the trench.

Preferably, the semiconductor is silicon, the first conductivity type is n-type conductivity, and a cathode electrode is provided on the first face.

The lower portions of the trenches preferably correspond to approximately 25 to 40% of the depth of the trenches. In some embodiments, the trench extends into the cathode region, with the insulated lower portions of the trench preferably extending between the cathode region and the drift region.

The insulating region preferably comprises silicon dioxide, which can be either deposited or thermally grown.

In some embodiments, a polysilicon region is disposed on the insulating region and forms part of the anode electrode.

The present invention also provides a method of forming a trench Schottky rectifier. The method comprises: (a) forming a semiconductor region having first and second opposing faces, with the semiconductor region comprising a cathode region of first conductivity type adjacent the first face and a drift region of the first conductivity type adjacent the second face, and with the drift region having a lower net doping concentration than that of the cathode region; (b) forming one or more trenches extending from the second face into the semiconductor region, with the trenches defining one or more mesas within the semiconductor region; (c) forming an insulating region adjacent the semiconductor region in lower portions of the trench; (d) and forming an anode electrode that is (i) adjacent to and forms a Schottky rectifying contact with the semiconductor region at the second face, (ii) adjacent to and forms a Schottky rectifying contact with the semiconductor region within upper portions of the trench and (iii) adjacent to the insulating region within the lower portions of the trench.

The step of forming the semiconductor region preferably comprises providing a semiconductor substrate that corresponds to the cathode region, and growing an epitaxial semiconductor layer that corresponds to the drift region on the substrate.

The step of forming the trenches preferably comprises the steps of forming a patterned masking layer over the second face of the semiconductor region and etching the trenches through the masking layer.

The step of forming the insulating region can comprise providing an oxide layer over the second face and in the trenches, and subsequently etching portions of the oxide layer. In some embodiments, a photoresist pattern is provided on the oxide layer (which can be thermally grown), and portions of the oxide layer not covered by the photoresist etched, whereupon the photoresist is removed. In other embodiments, a polysilicon layer is provided on the oxide layer (which can be thermally grown), and the polysilicon layer is etched such that portions of the oxide layer over the second face and over the upper portions of the trenches are exposed, and these exposed portions are subsequently removed by etching.

The step of forming the insulating region can also comprise depositing an oxide layer. For example, a tetraethylorthosilicate layer can be deposited on the second face and within the trenches. The tetraethylorthosilicate layer can then be etched until it is removed from the second surface and the upper portions of the trenches. Subsequently, the tetraethylorthosilicate can be converted into a high-density silicon dioxide layer.

One advantage of the present invention is that a novel Schottky barrier rectifier is provided having low forward-biased voltage drop, low reverse-biased leakage current and high breakdown voltage.

Another advantage is that such a Schottky barrier rectifier can be made using simple, and thus economical, manufacturing techniques.

Still other embodiments and advantages will become readily apparent to those skilled in the art upon review of the Detailed Description, Examples and claims set forth below.

DETAILED DESCRIPTION OF CERTAIN PREFERRED EMBODIMENTS OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

Figure 1:
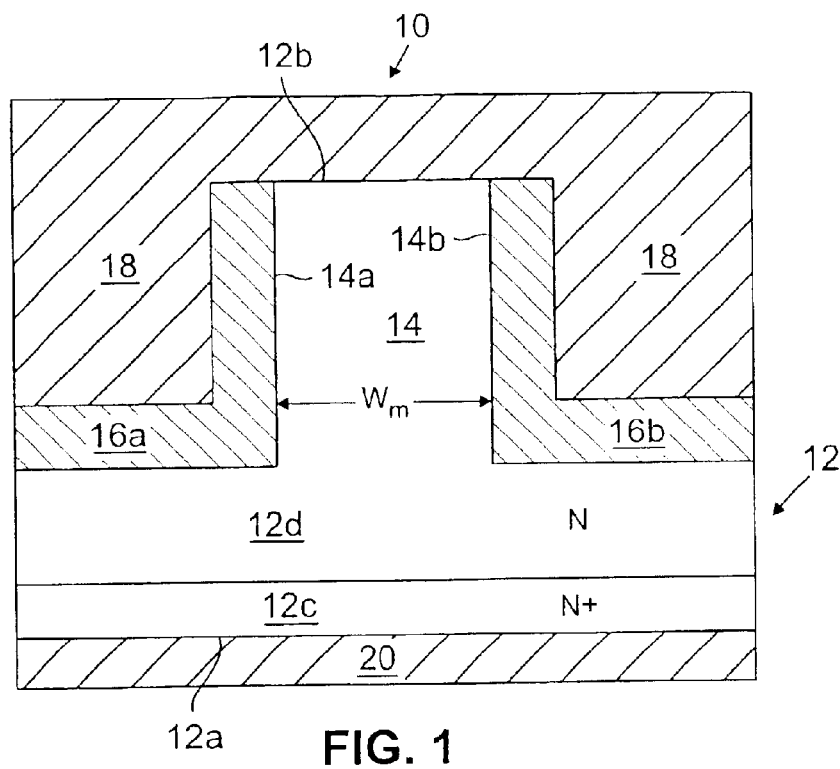
FIG. 1 illustrates a cross-sectional representation of a trench MOS barrier Schottky rectifier according to the prior art.
Figure 3:
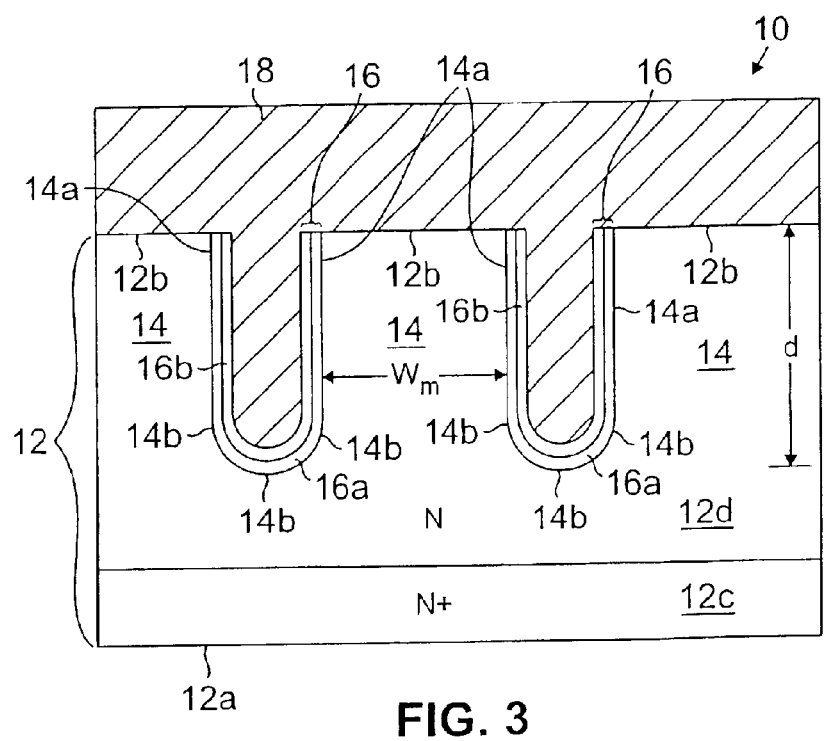
FIG. 3 is a cross-sectional representation of a trench Schottky rectifier according to an embodiment of the present invention.
Figure 2:
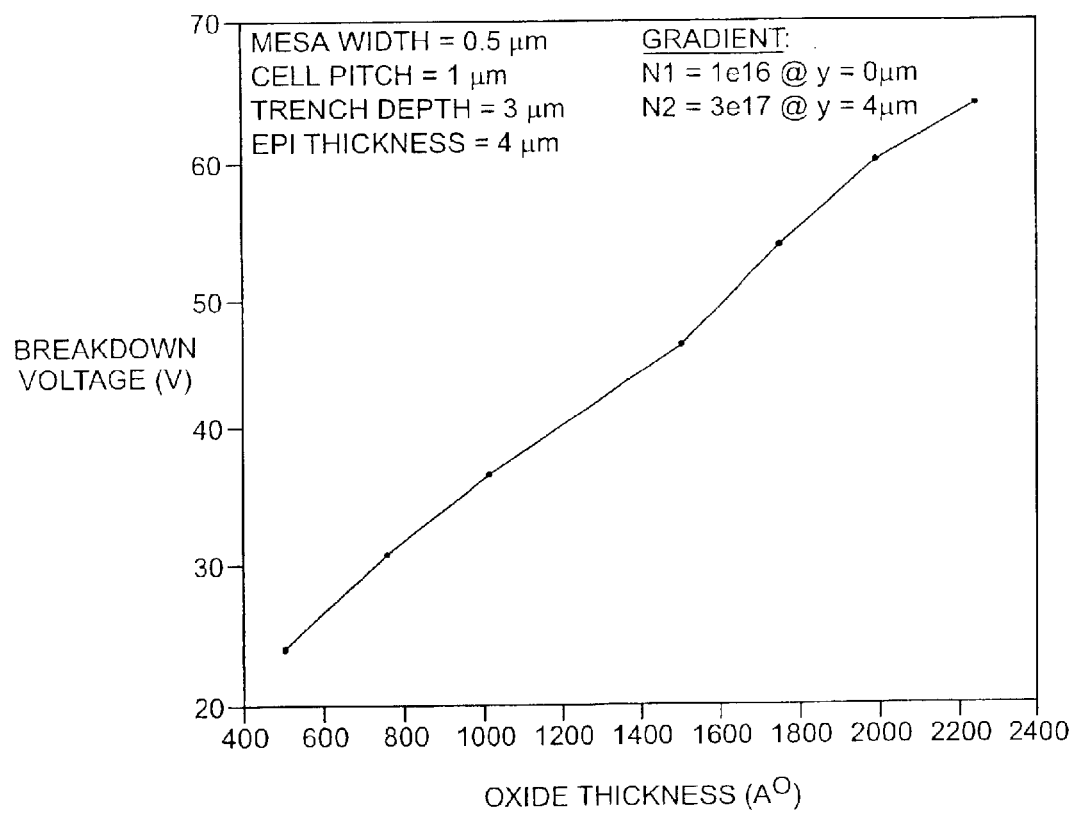
FIG. 2 is a graphical illustration of breakdown voltage versus trench oxide thickness for a Schottky rectifier such as shown in FIG. 1.

Referring now to FIG. 3, a cross-sectional illustration of a Schottky barrier rectifier according to the present invention is shown. The rectifier 10 includes a semiconductor region 12 of first conductivity type, typically N-type conductivity, having a first face 12a and second opposing faces 12b. The substrate semiconductor region 12 preferably comprises a relatively highly doped cathode region 12c (shown as N+) adjacent first face 12a. As illustrated, the cathode region 12c is doped to a first conductivity type dopant concentration of about $5 \times 10^{19}/cm^3$. A drift region 12d of first conductivity type (shown as N) preferably extends from the cathode region 12c to second faces 12b. As illustrated, the drift region 12d is doped to a first conductivity type dopant concentration of about $3.3 \times 10^{16}/cm^3$ for a 30 Volt device. Drift region 12d and cathode region 12c form a non-rectifying N+/N junction.

Mesas 14 having cross-sectional width "Wm" are formed in the drift region 12d. Mesas are defined by opposing trenches. Insulating regions 16 (in this case, shown as thermally grown oxide layers) are formed within the trenches and are adjacent the semiconductor region 12. Each insulating region 16 includes first and second insulating regions 16a and 16b. Insulating region 16a is a thermally grown layer. Insulating region 16b is grown over insulating region 16a by a deposition technique. As explained below, the thermally grown region advantageously produces an oxide-semiconductor interface with relatively few defects while the deposited region allows a relatively thick trench oxide layer to be grown. Insulating regions 16 typically have a total thickness on the order of about 700 to 2000 Angstroms. Wm is typically on the order of 1 micron. Trench depth "d" is typically on the order of 3 microns.

Mesas 14 extend in a third dimension (not shown) and can be of stripe, rectangular, cylindrical or other similar geometry. Hence, as will be understood by those skilled in the art, mesas 14 can be formed in the semiconductor region 12 using numerous trench configurations.

For example, mesa 14 can be formed between pairs of adjacent linear trenches that extend in a third dimension. As another example, an annular-shaped trench can form mesa 14. For both of these examples, when viewed in transverse cross section, the trenches will appear as shown in FIG. 3.

Anode electrode 18 is found immediately adjacent to the drain region 12d along second faces. Anode electrode 18 is also found immediately adjacent to the insulating regions 16. Anode electrode 18 forms a Schottky barrier rectifying junction where it contacts the semiconductor drain region 12d, i.e., along second faces 12b.

Finally, a cathode electrode (not shown) is provided adjacent the cathode region 12c at the first face 12a. The cathode electrode preferably ohmically contacts the cathode region 12c.

Such a rectifier has a high reverse bias breakdown voltage. Without wishing to be held to any particular theory of operation, it is believed that this design provides an insulating region 16 that causes charge coupling to occur between the anode electrode 18 and mesa 14, favorably affecting the voltage profiles within the mesa structure and providing high reverse bias breakdown voltages and low leakage currents. It is well within the skill of those in the art to optimize the thickness of first insulating layer 16a relative to the thickness of the second insulating layer 16b.

Figure 4:
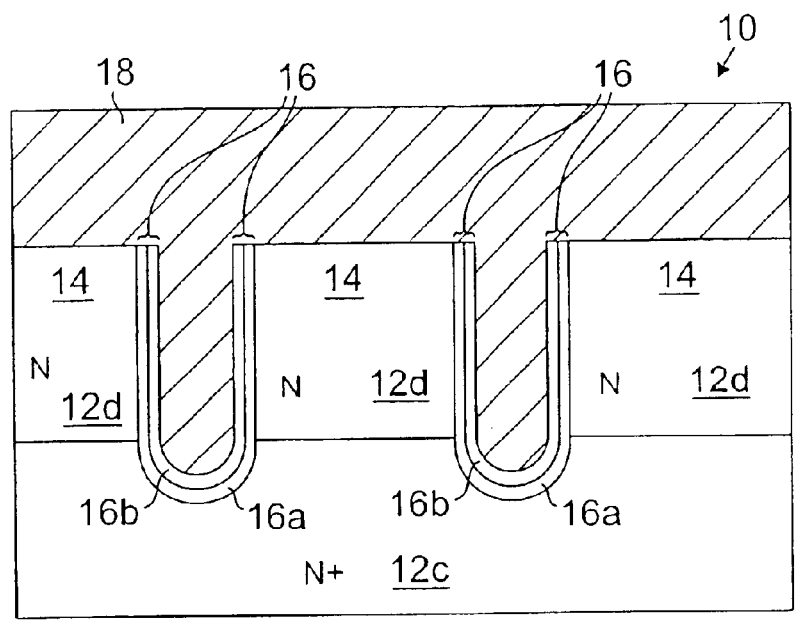
FIG. 4 is a cross-sectional representation of a trench Schottky rectifier according to an embodiment of the present invention.

Another embodiment of the present invention is provided in FIG. 4. This embodiment is similar to that of FIG. 3, except that the trenches extend beyond drift regions 12d and into cathode region 12c.

Figure 5:
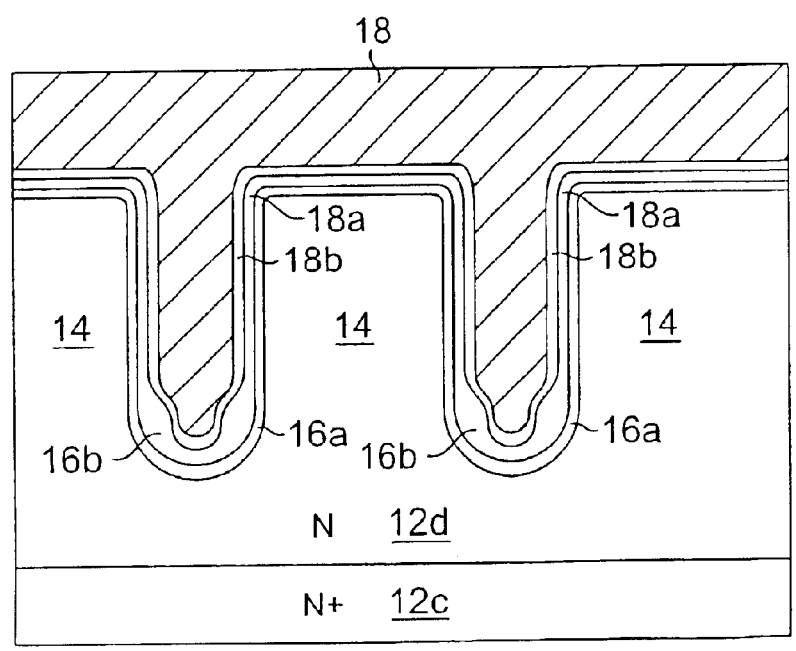
FIG. 5 is a cross-sectional representation of a trench Schottky rectifier according to an embodiment of the present invention.
Figure 6:
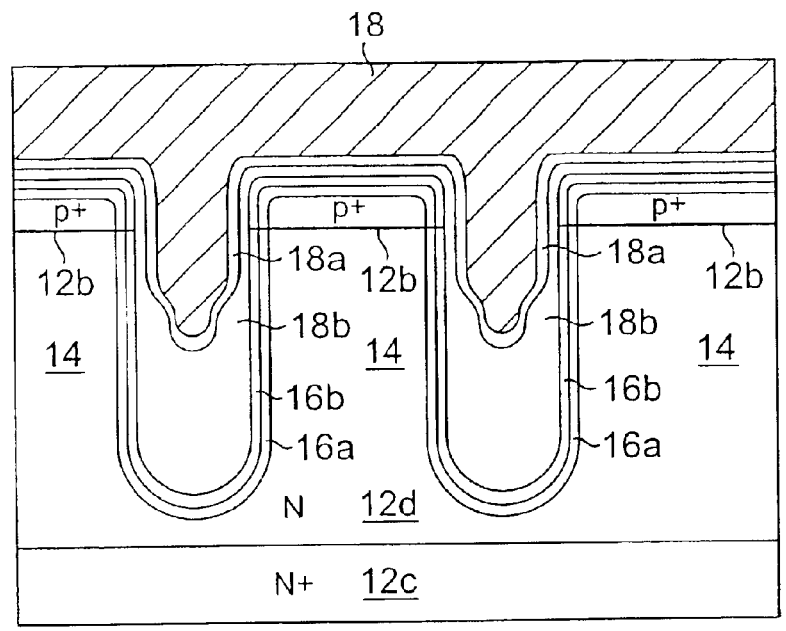
FIG. 6 is a cross-sectional representation of a trench Schottky rectifier according to an embodiment of the present invention.

Other embodiments of the present invention are shown in FIGS. 5 and 6. In FIG. 5, the Schottky rectifying characteristics of the contact between the anode electrode and the drift region 12d are improved by using a multi-layer anode electrode, which comprises a titanium layer 18a, a titanium-tungsten layer 18b and a tungsten layer 18c. In this specific example, the titanium-tungsten layer 18b comprises 50% titanium and 50% tungsten. Further improvements in forward biased voltage drop are made by forming P+ regions 12e within the device (see FIG. 6). In this specific example, the doping concentration of the P+ regions is $1 \times 10^{19}/cm^3$.

Figure 7A:
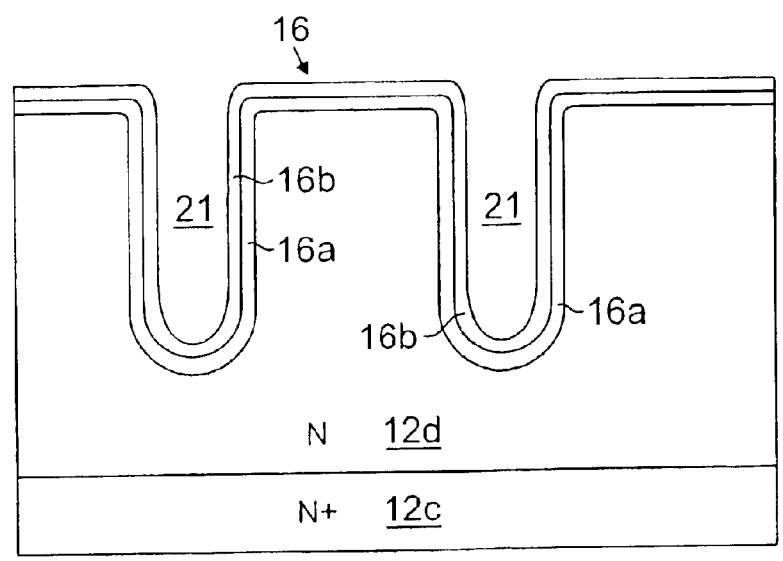
FIGS. 7A–7B are cross sectional views illustrating a method of forming the trench Schottky rectifier of FIG. 3, according to an embodiment of the invention.
Figure 7B:
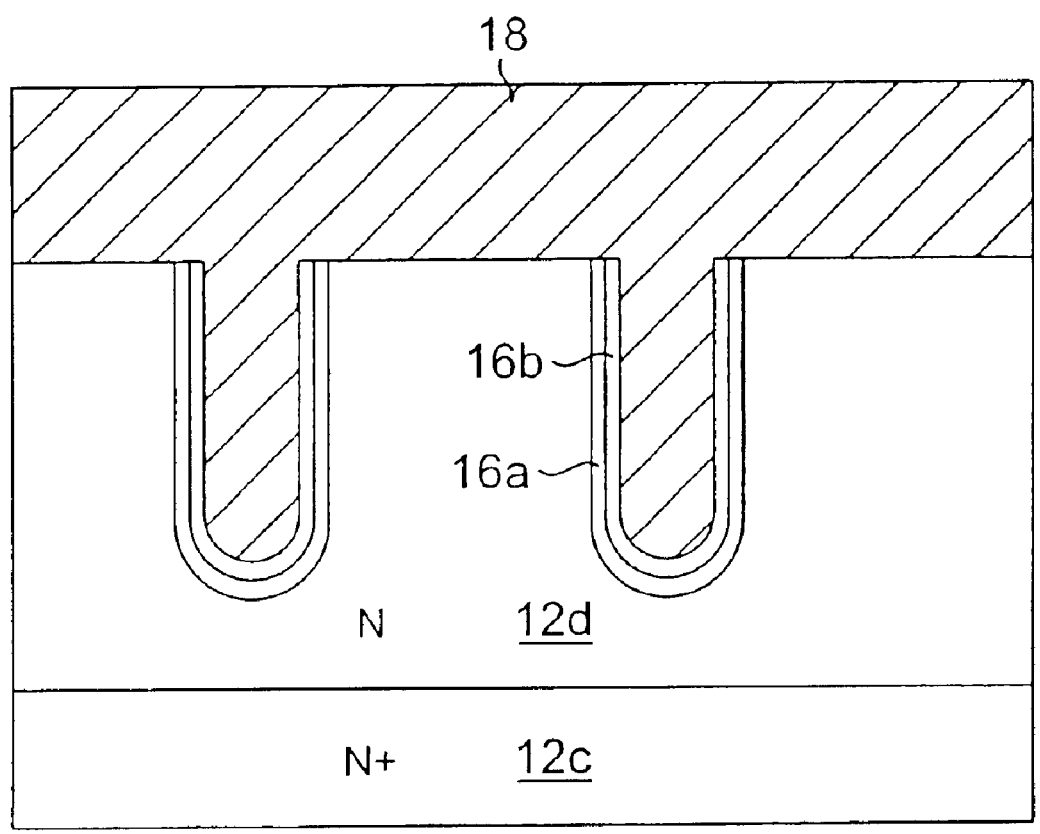

FIGS. 7A–7B illustrate an embodiment of the present invention for providing the trench Schottky rectifier 10 shown in FIG. 3. Referring now to these figures, an N-doped epitaxial layer (corresponding to drift region 12d) is grown on a conventionally N+ doped substrate (corresponding to cathode region 12c). Epitaxial layer 12d is typically about 7 microns thick. Next, a photoresist masking process is used to form mask portions (not shown), which define the location of trenches 21. Trenches 21 are preferably dry etched through openings between mask portions by reactive ion etching, typically to a depth of about 3 microns. Mask portions are removed and an insulating layers 16a and 16b are formed over the surface of the entire structure by thermal growth and deposition, respectively. Insulating layers 16a and 16b are typically oxide layers such as silicon dioxide ($SiO_2$). Thicknesses in the vicinity of about 700 to 2000 Angstroms are typical for thermal oxide layer 16.

Growth by thermal oxidation is a common technique that may be employed to grow silicon dioxide layer 16a. In all thermal methods, silicon dioxide is formed from silicon (Si). Due to the presence of oxygen, this reaction takes place even at room temperature. However, elevated temperatures (typically between 900 and 1200 C) are generally required to achieve quality oxides in reasonable process times. Where oxygen is used as an oxygen source, the reaction is referred to as dry oxidation. Where water vapor is used as an oxygen source, the reaction is referred to as steam oxidation or wet oxidation. The growth rates associated with steam oxidation are greater that those associated with dry oxidation. A variety of thermal oxidation techniques may be employed to grow silicon dioxide layer 16a, including atmospheric growth techniques, rapid thermal oxidation, high-pressure oxidation, and anodic oxidation. Thermal growth is advantageous because the slow growth rates associated therewith facilitate the formation of defect-free layers.

Insulating layer 16b may be grown by a deposition technique such as chemical vapor deposition (CVD). In CVD, the material of interest is deposited intact on the wafer surface. Several CVD techniques are available, including atmospheric pressure chemical vapor deposition (APCVD), low-pressure chemical vapor deposition (LPCVD) and plasma-enhanced CVD (PECVD). Assuming once again that insulating layer 16b is silicon dioxide, in an exemplary APCVD process, silane ($SiH_4$) and oxygen ($O_2$) are mixed and reacted in a deposition chamber, typically at about 450 C, forming $SiO_2$. In a typical LPCVD process, higher temperatures, for example, about 900 C, are used to react dichlorosilane ($SiCl_2H_2$) with nitrous oxide ($NO_2$) to form the $SiO_2$. In one known PECVD process, lower temperatures, typically about 400 C, are used and $SiO_2$ is formed using tetraethyl orthosilicate (TEOS) ($Si(OC_2H_5)_4$) sources in the presence of oxygen. If desired, the deposited CVD layer can be densified, for example, by a high temperature anneal step. After densification, the deposited silicon dioxide film is close to the structure and properties of a thermally grown oxide. A primary advantage of deposition techniques over thermal growth techniques is that the deposition techniques provide greater growth rates. As a result, a relatively thick trench oxide layer can be readily produced. Moreover, since a thermally grown layer is provided at the oxide-semiconductor interface, a thick oxide layer is achieved without producing an unduly high defect density at the interface.

Finally, as shown in FIG. 7B, anode electrode 18 is provided to complete the structure. For example, the anode electrode can be obtained by providing (a) a Ti:W layer, followed by (b) a Pt:Si layer, followed by (c) an Al layer. As another example, the anode electrode can be obtained by providing (a) a Ti:N layer, followed by (b) a Pt: Si layer, followed by (c) an Al layer.

Yet another example of the anode electrode 18 structure is found in FIG. 5 (see discussion above). In this example, the anode electrode is obtained by providing (a) Ti layer, followed by (b) a Ti:W layer, followed by (c) a W layer.

In the event that a structure like that of FIG. 6 is to be fabricated, the above steps can be followed except that, after growing the epitaxial layer 12*d*, an P+ layer 12*e* is formed in the upper portion of epitaxial layer 12*d*, for example, by ion implantation and diffusion.

The present invention thus provides a trench Schottky rectifier and methods of making the same. The resulting Schottky rectifier has a thick trench oxide layer and thus a high breakdown voltage. Although the present invention has been described with respect to several exemplary embodiments, there are many other variations of the above-described embodiments that will be apparent to those skilled in the art. It is understood that these variations are within the teaching of the present invention, which is to be limited only by the claims appended hereto.

What is claimed is:

1. A method of forming a trench Schottky rectifier, comprising:

forming a semiconductor region having first and second opposing faces, said semiconductor region comprising a cathode region of a first conductivity type adjacent the first face and a drift region of said first conductivity type adjacent the second face, said drift region having a lower net doping concentration than that of said cathode region;

forming one or more trenches extending from said second face into said semiconductor region, said trenches defining one or more mesas within said semiconductor region;

forming an insulating region adjacent said semiconductor region in said trench by thermally growing a first insulating layer contacting said semiconductor region and depositing a second insulating layer over said first thermally grown insulating layer; and forming an anode electrode that is (a) adjacent to and forms a Schottky rectifying contact with said semiconductor region at said second face, and (b) adjacent to said insulating region in said trench.

2. The method of claim 1 wherein said second insulating layer is deposited by chemical vapor deposition.

3. The method of claim 1, further comprising providing a cathode electrode on said first face of said semiconductor region.

4. The method of claim 1, wherein said step of forming said semiconductor region comprises providing a semiconductor substrate, said semiconductor substrate corresponding to said cathode region; and growing an epitaxial semiconductor layer on said substrate, said epitaxial layer corresponding to said drift region.

5. The method of claim 1, wherein said step of forming said trenches comprises the steps of forming a patterned masking layer over the second face of the semiconductor region and etching said trenches through said masking layer.

6. The method of claim 1, wherein said trenches are formed such that they extend into said cathode region.

7. The method of claim 1 wherein said insulating region comprises an oxide.

8. The method of claim 1 wherein said insulating region comprises silicon dioxide.

9. The method of claim 7 wherein said second insulating layer is deposited by chemical vapor deposition.

10. The method of claim 8 wherein said second insulating layer is deposited by chemical vapor deposition.

* * * * *

UNITED STATES PATENT AND TRADEMARK OFFICE
CERTIFICATE OF CORRECTION

| | |
|---|---|
| PATENT NO. | : 6,770,548 B2 |
| APPLICATION NO. | : 10/429817 |
| DATED | : August 3, 2004 |
| INVENTOR(S) | : Fwu-Iuan Hshieh et al. |

It is certified that error appears in the above-identified patent and that said Letters Patent is hereby corrected as shown below:

Col. 1, Line 7, after "2001", insert -- , --.

Col. 2, Line 38, after "FIG.", change "1" to -- 1 --.

Col. 2, Line 39, after "FIG.", change "12" to -- 12 --.

Col. 2, Line 49, after "advantageous", insert -- when --.

Col. 4, Line 23, before "set", change "claims" to -- Claims --.

Col. 6, Line 14, before "insulating", delete -- an --.

Col. 6, Line 31, after "greater", change "that" to -- than --.

Col. 7, Line 4, before layer, change "a Pt: Si" to -- a Pt:Si --.

Col. 7, Line 12, before "P+", change "an" -- a --.

Claim 2, Line 11, after "1", insert -- , --.

Claim 7, Line 28, after "1", insert -- , --.

Claim 8, Line 30, after "1", insert -- , --.

Claim 9, Line 32, after "7", insert -- , --.

UNITED STATES PATENT AND TRADEMARK OFFICE
CERTIFICATE OF CORRECTION

PATENT NO. : 6,770,548 B2
APPLICATION NO. : 10/429817
DATED : August 3, 2004
INVENTOR(S) : Fwu-Iuan Hshieh et al.

It is certified that error appears in the above-identified patent and that said Letters Patent is hereby corrected as shown below:

Claim 10, Line 34, after "8", insert -- , --.

Signed and Sealed this

Fifteenth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 6,770,548 B2
APPLICATION NO. : 10/429817
DATED : August 3, 2004
INVENTOR(S) : Fwu-Iuan Hshieh et al.

It is certified that error appears in the above-identified patent and that said Letters Patent is hereby corrected as shown below:

Col. 1, Line 7, after "2001", insert -- , --.

Col. 2, Line 38, after "FIG.", change "1" to -- 1 --.

Col. 2, Line 39, after "FIG.", change "12" to -- 12 --.

Col. 2, Line 49, after "advantageous", insert -- when --.

Col. 4, Line 23, before "set", change "claims" to -- Claims --.

Col. 6, Line 14, before "insulating", delete -- an --.

Col. 6, Line 31, after "greater", change "that" to -- than --.

Col. 7, Line 4, before layer, change "a Pt: Si" to -- a Pt:Si --.

Col. 7, Line 12, before "P+", change "an" -- a --.

Column 8, Claim 2, Line 11, after "1", insert -- , --.

Column 8, Claim 7, Line 28, after "1", insert -- , --.

Column 8, Claim 8, Line 30, after "1", insert -- , --.

Column 8, Claim 9, Line 32, after "7", insert -- , --.

UNITED STATES PATENT AND TRADEMARK OFFICE
CERTIFICATE OF CORRECTION

PATENT NO. : 6,770,548 B2
APPLICATION NO. : 10/429817
DATED : August 3, 2004
INVENTOR(S) : Fwu-Iuan Hshieh et al.

It is certified that error appears in the above-identified patent and that said Letters Patent is hereby corrected as shown below:

Column 8, Claim 10, Line 34, after "8", insert -- , --.

This certificate supersedes the Certificate of Correction issued April 15, 2008.

Signed and Sealed this

Sixth Day of May, 2008

JON W. DUDAS
*Director of the United States Patent and Trademark Office*